(12) United States Patent
Ji et al.

(10) Patent No.: US 11,515,834 B2
(45) Date of Patent: Nov. 29, 2022

(54) WATER GUIDING ASSEMBLY AND PHOTOVOLTAIC MODULE

(71) Applicant: Sungrow Renewables Development Co., Ltd., Hefei (CN)

(72) Inventors: Kepeng Ji, Hefei (CN); Erbin Li, Hefei (CN); Juan Chen, Hefei (CN); Yanna Huang, Hefei (CN); Meng Liu, Hefei (CN)

(73) Assignee: Sungrow Renewables Development Co., Ltd., Hefei (CN)

( * ) Notice: Subject to any disclaimer, the term of this patent is extended or adjusted under 35 U.S.C. 154(b) by 0 days.

(21) Appl. No.: 17/369,018

(22) Filed: Jul. 7, 2021

(65) Prior Publication Data

US 2022/0014143 A1 Jan. 13, 2022

(30) Foreign Application Priority Data

Jul. 8, 2020 (CN) .......................... 202021343323.8

(51) Int. Cl.
*H02S 40/10* (2014.01)
*H02S 30/10* (2014.01)
*H05K 5/06* (2006.01)

(52) U.S. Cl.
CPC .............. *H02S 30/10* (2014.12); *H02S 40/10* (2014.12); *H05K 5/069* (2013.01)

(58) Field of Classification Search
CPC ................................. H02S 40/10; H02S 40/12
See application file for complete search history.

(56) References Cited

U.S. PATENT DOCUMENTS

| | | | | |
|---|---|---|---|---|
| 8,833,714 B2* | 9/2014 | Haddock | ................. | H02S 20/22 |
| | | | | 248/500 |
| 9,016,292 B1* | 4/2015 | Schneider | ............... | F24S 10/30 |
| | | | | 136/246 |
| 9,973,142 B2* | 5/2018 | Stearns | ................... | E04D 13/10 |
| 2011/0146661 A1* | 6/2011 | Dudas | ..................... | H02S 40/10 |
| | | | | 126/573 |
| 2013/0081673 A1* | 4/2013 | Kinyon | ................... | H02S 40/10 |
| | | | | 136/251 |
| 2015/0107168 A1* | 4/2015 | Kobayashi | ............. | H02S 20/23 |
| | | | | 52/173.3 |
| 2018/0094438 A1* | 4/2018 | Wu | .......................... | E04D 3/30 |

(Continued)

*Primary Examiner* — Hung V Ngo
(74) *Attorney, Agent, or Firm* — Wolf, Greenfield & Sacks, P.C.

(57) ABSTRACT

A water guiding assembly configured to drain water or discharge other liquid or solid substances for a photovoltaic assembly is provided. The water guiding assembly includes a water guider and a mounting component. The water guider includes a water guiding portion, the water guiding portion has a fitting portion configured to abut against a frame of the photovoltaic assembly, to provide a gap between the water guiding portion and the frame to form a guiding channel. The mounting component includes a fixing portion and a connecting portion, an end of the connecting portion is detachably connected to the water guider, and another end of the connecting portion is connected to the fixing portion to form a clamping opening with the water guider and the fixing portion, which is configured to clamp the frame. The connecting portion is provided with a discharge channel butted with the guiding channel.

17 Claims, 6 Drawing Sheets

(56) References Cited

U.S. PATENT DOCUMENTS

2019/0140585 A1\* 5/2019 Stettenheim ............ H02S 30/10
2022/0014145 A1\* 1/2022 Ji ............................ H02S 40/10
2022/0123688 A1\* 4/2022 Mascolo ................. H02S 20/24

\* cited by examiner

WATER GUIDING ASSEMBLY AND PHOTOVOLTAIC MODULE

CROSS REFERENCE TO RELATED APPLICATIONS

This application claims the priority to Chinese Patent Application No. 202021343323.8 titled "WATER GUIDING ASSEMBLY AND PHOTOVOLTAIC MODULE", filed with the China National Intellectual Property Administration on Jul. 8, 2020, which is incorporated herein by reference in its entirety.

FIELD

The present application relates to the technical field of photovoltaic module manufacturing, and in particular to a water guiding assembly and a photovoltaic module.

BACKGROUND

A photovoltaic assembly includes a glass layer and a photovoltaic power generation layer sequentially from top to bottom, and the glass layer and the photovoltaic power generation layer are fixed together by a frame in the circumferential direction. Generally, the frame of the photovoltaic assembly is higher than the glass layer which is at the upper layer, and thus rainwater and dust may easily remain on the glass layer. Since the photovoltaic power generation layer receives light energy from light transmitted through the glass layer, if there is rainwater and dust remain on the glass layer, the rainwater or dust will prevent the light from entering the photovoltaic power generation layer through the glass layer, which affects the power generation of the photovoltaic power generation layer, and thus the function of an antireflection coating of the photovoltaic power generation layer is weakened.

Currently, a conventional way to cope with the accumulation of water or dust on the glass layer is to provide a guiding hole or a water guiding assembly on the photovoltaic assembly. However, in a case that the guiding hole is provided in the frame to discharge accumulated water and dust, the guiding hole is required to be provided in the frame or the glass layer, leading to high requirements on the manufacturing process of the photovoltaic assembly, which is difficult to achieve. The water guiding assembly is thereby provided on the photovoltaic assembly to discharge the accumulated water and dust. However, an additional support component is required to fix the water guiding assembly, and after the water guiding assembly is fixed to the support component, the support component is fixed to the frame by screws. The installation process is complicated. Also, the support component and the water guiding assembly have independent functions, and the structural requirements are complex, which increase manufacture and installation costs.

SUMMARY

An object of the present application is to provide a water guiding assembly and a photovoltaic module, to address the technical problems of high production and installation costs of the conventional water guiding assembly.

In order to achieve the above object, a water guiding assembly configured to drain water or discharge other liquid or solid substances for a photovoltaic assembly is provided according to the present application. The water guiding assembly includes:

a water guider, where the water guider includes a water guiding portion, the water guiding portion has a fitting portion configured to abut against a frame of the photovoltaic assembly, to provide a gap between the water guiding portion and the frame, so as to form a guiding channel; and a mounting component, where the mounting component includes a fixing portion and a connecting portion, the connecting portion has one end detachably connected to the water guider, and another end connected to the fixing portion, to form a clamping opening with the water guider and the fixing portion; the clamping opening is configured to clamp the frame; where the connecting portion is provided with a discharge channel butted with the guiding channel.

In an embodiment, an inner wall of the guiding channel has wettability.

In an embodiment, the fitting portion has a fitting surface, the water guiding portion further has a water guiding surface connected to the fitting surface, and an angle is formed between the water guiding surface and the fitting surface, which is greater than 180 degrees, to allow the gap to be formed between the water guiding surface and the frame when the fitting surface abuts against the frame, to form the guiding channel.

In an embodiment, the water guiding surface is an arc-shaped surface.

In an embodiment, the water guiding portion includes a water guiding surface, and the fitting portion is a boss protruding downward from the water guiding surface; the boss has a fitting surface, and the fitting surface is away from the water guiding surface and abuts against the frame.

In an embodiment, the water guider further includes a mounting portion perpendicular to the water guiding portion, and the mounting portion is provided with a buckle at an end that is away from the water guiding portion; the connecting portion is perpendicular to the fixing portion, the connecting portion is provided with a buckle slot at an end that is away from the fixing portion, and the buckle is in a snap fit with the buckle slot.

In an embodiment, the fixing portion is provided with an anti-separation buckle at an end that is away from the connecting portion, and the anti-separation buckle is configured to with the frame.

In an embodiment, the connecting portion is provided with multiple buckle slots, and the buckle slots are arranged at intervals in a direction toward the fixing portion.

In an embodiment, the connecting portion includes a connecting segment and a pressing segment, the pressing segment is perpendicular to the connecting segment, and the pressing segment presses against a surface, away from the fitting portion, of the water guiding portion.

In an embodiment, a width of the connecting portion is less than or equal to a width of the fitting portion, to form, at an edge of the connecting portion, the discharge channel that is connected to the guiding channel.

A photovoltaic module is further provided by the present application, including the photovoltaic assembly and the water guiding assembly described above, where the guiding channel with a water guiding port is formed between the water guider of the water guiding assembly and a top of the frame of the photovoltaic assembly; where the discharge channel of the mounting portion of the water guiding assembly is butted with the guiding channel, and the water guiding port is located at the photovoltaic assembly.

According to the water guiding assembly and photovoltaic module in the embodiments of the present application, by providing the fitting portion on the water guiding portion, a capillary guiding channel is directly formed between the water guiding portion and the frame after the water guiding assembly is mounted. When there is water accumulated on a glass layer, which is located at an inner side of the frame, the accumulated water flows to the guiding channel, such that the water or dust in the frame is introduced to the water guider. The water guider is mounted on the frame through the mounting component, and the mounting component includes a fixing portion and a connecting portion. Since the connecting portion detachably connected with the water guider, the disassembly and assembly of the water guider are realized. Since a structure having the clamping opening can be formed by the connecting portion, the water guider and the fixing portion after the connecting portion is connected to the water guider, the water guider is mounted and fixed on the frame through the clamping opening, which simplifies the installation of the water guider and reduces the installation cost. Since the connecting portion is provided with the discharge channel butted with the guiding channel, the water guider is capable of guiding water to the discharge channel via the guiding channel, and further discharges the water out of the frame through the discharge channel. The mounting component has a drainage function, so that the structure of the water guider can be simplified and the production cost can be reduced.

BRIEF DESCRIPTION OF THE DRAWINGS

For more clearly illustrating embodiments of the present application or the technical solutions in the conventional technology, drawings referred to for describing the embodiments or the conventional technology will be briefly described hereinafter. Apparently, drawings in the following description are only examples of the present application, and for the person skilled in the art, other drawings may be obtained based on the set drawings without any creative efforts.

REFERENCE NUMERALS

Figure 1:
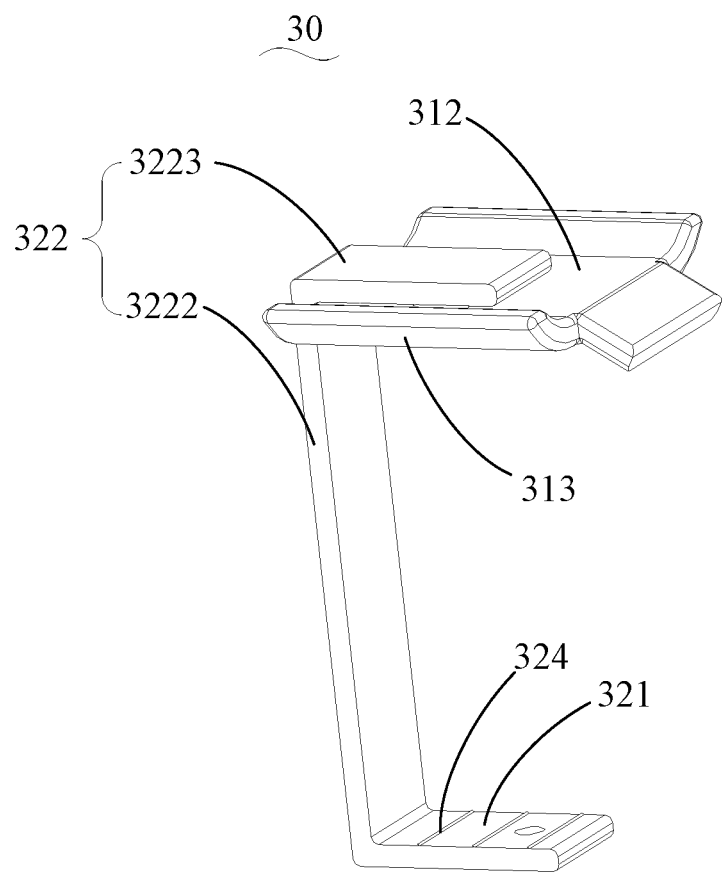
FIG. 1 is a perspective structural view of a water guiding assembly according to an embodiment of the present application.

| 100 | photovoltaic assembly, | | |
|---|---|---|---|
| 10 | photovoltaic power generation layer, | | |
| 20 | frame, | 21 | upper end face, |
| 22 | lower end face, | 23 | outer side face, |
| 30 | water guiding assembly, | 31 | water guider, |
| 311 | water guiding portion, | 312 | fitting portion, |
| 3121 | fitting surface, | 313 | water guiding surface, |
| 3131 | first water guiding surface, | 3132 | second water guiding surface, |
| 314 | guiding channel, | 315 | mounting portion, |
| 316 | elastic buckle, | 32 | mounting component, |
| 321 | fixing portion, | 3211 | anti-separation buckle, |
| 322 | connecting portion, | 3221 | buckle slot, |
| 3222 | connecting segment, | 3223 | pressing segment, |
| 323 | discharge channel, | 324 | barb, |
| 40 | glass layer. | | |

DETAILED DESCRIPTION OF THE EMBODIMENTS

Technical solutions according to the embodiments of the present application will be described clearly and completely as follows in conjunction with the accompany drawings in the embodiments of the present application. It is obvious that the described embodiments are only a part of the embodiments according to the present application, rather than all of the embodiments. All the other embodiments obtained by those skilled in the art based on the embodiments in the present application without any creative work belong to the scope of protection of the present application.

It should be noted that, all directional indicators (such as up, down, left, right, front, back . . . ) in the embodiments of the present application are only used for explaining a relative position relationship and movement situation among components in a certain specific posture (as shown in the drawings). If the specific posture changes, the directional indicators will change accordingly.

In addition, the terms "first" and "second" in the embodiments of the present application are only used for descriptive purposes, and cannot be understood as indicating or implying its relative importance or implicitly indicating the number of the indicated technical features. Therefore, the features defined with "first" and "second" may include at least one of the features explicitly or implicitly. In addition, the technical solutions of the embodiments can be combined with each other on the basis that the combination of the technical solutions can be implemented by the person skilled in the art. When the technical solutions are contradictory or the combination of the technical solutions be implemented, it should be considered that such a combination of technical solutions does not exist, and is not within the protection scope of the present application.

A water guiding assembly applicable to a photovoltaic assembly is provided by the application, which is configured to drain water or discharge other liquid or solid substances for the photovoltaic assembly. Specifically, the water guiding assembly is mounted on a frame of the photovoltaic assembly.

Referring to FIGS. 1 to 6, the water guiding assembly 30 includes a water guider 31 and a mounting component 32. The water guide 31 is configured to guide water, and the mounting component 32 is configured to fix the water guider 31 and drain water.

In the embodiment, the water guiding assembly 30 is applied to the photovoltaic assembly, to achieve the function of water drainage or other substances removal by cooperation with the photovoltaic assembly. It should be noted here that the photovoltaic assembly includes a frame 20, a glass layer 40 and a photovoltaic power generation layer 10. The glass layer 40 is located above the photovoltaic power generation layer 10, and the glass layer 40 and the photovoltaic power generation layer 10 are mounted in the frame 20. An end face of the frame 20, located on the same side of the glass layer, is defined as an upper end face 21, and an end surface that is opposite to the upper end face 21 is defined as a lower end face 22. A surface of the frame 20 between the upper end face 21 and the lower end face 22 and located at an outer side of the frame 20 is defined as an outer side face 23; and a surface of the frame 20 for mounting the glass layer 40 and the photovoltaic power generation layer 10 is defined as an inner side face.

The water guider 31 includes a water guiding portion 311, the water guiding portion 311 has a fitting portion 312 configured to abut against the frame 20 of the photovoltaic assembly, so as to provide a gap between the water guiding portion 311 and the frame 20 to form a guiding channel 314, where an inner wall of the guiding channel 314 has wettability.

The mounting component 32 includes a fixing portion 321 and a connecting portion 322, the connecting portion 322 has one end detachably connected to the water guider 31 and another end connected to the fixing portion 321, to form a clamping opening with the water guider 31 and the fixing portion 321, and the clamping opening is used to clamp the frame 20. The connecting portion 322 is provided with a discharge channel 323 butted with the guiding channel 314. That is, the mounting component 32 is provided with the discharge channel 323 to butt with the guiding channel 314, and the water drained from the guiding channel 314 is discharged through the discharge channel 323, thus the mounting component 32 functions to drain the water while fixing the water guider 31. With the above arrangement, there is no need to provide a drainage channel in the water guider 31, which simplifies the structure of the water guider 31, and thereby reducing the production cost of the water guider 31.

Specifically, when the water guiding assembly 30 is mounted on the frame 20, the water guiding portion 311 is located at the upper end face 21 of the frame 20. One end of the water guiding portion 311 is located on the glass layer 40 which is at the inner side face of the frame 20, and another end of the water guiding portion 311 toward the outer side face 23 of the frame 20. The mounting component 32 is located at the outer side face 23 of the frame 20, and the connecting portion 322 of the mounting component 32 is connected to the another end of the water guiding portion 311 which is away from the glass layer 40. A U-shaped clamping opening is formed by the water guider 31, the connecting portion 322, and the fixing portion 321, and the U-shaped clamping opening clamps the frame 20, to fixing and mounting the water guider 31 on the frame 20.

The water guiding assembly 30 is mounted on the frame 20 of the photovoltaic assembly. The water guiding portion 311 is located at the upper end face 21 of the frame 20, and the guiding channel 314 is formed between the water guiding portion 311 and the upper end face 21 of the frame 20. The guiding channel 314 is butted with the discharge channel 323 on the connecting portion 322, the accumulated water or dust on the glass layer 40 is guided to the discharge channel 323 via the guiding channel 314, and then discharged out of the frame 20 through the discharge channel 323.

It should be noted that, the water guiding assembly 30 according to this embodiment employs the capillary principle to realize guiding the accumulated water to the discharge channel 323 by the water guiding portion 311. Specifically, with the arrangement of the fitting portion 312 of the water guiding portion 311, the gap is formed between the water guiding portion 311 and the frame 20 after the water guiding assembly 30 is mounted on the frame 20, and the gap forms the capillary guiding channel 314. When there is accumulated water on the glass layer 40 located at the inner side of the frame 20, the accumulated water flows along the guiding channel 314 in a direction toward the discharge channel 323, the water accumulated on the glass layer 40 and in the frame 20 is sucked into the water guiding portion 311 and further guided into the discharge channel 323. Since the discharge channel 323 is located at the outer side of the frame 20, the accumulated water is discharged out of the frame 20 along the discharge channel 323 under an action of gravity. Specifically, the discharge channel 323 is embodied as a channel formed by the mounting component 32 of the water guider 31 and the outer side face 23 of the frame 20. Since the capillary principle is adopted in this embodiment for guiding the water, which has certain water suction ability, compared to a manner of directly providing a guiding hole to drain water (without water suction ability), the water guiding assembly 30 in this embodiment can discharge accumulated water or other substances more effectively.

In addition, since a size of the water guiding channel may affect capillary performance, in this embodiment, the fitting portion 312 is provided to allow the guiding channel 314 to be directly formed between the water guiding portion 311 and the frame 20 when the water guiding assembly 30 is mounted, which prevents mounting misalignment of the guiding channel 314, improves a mounting accuracy of the water guiding assembly 30, and thereby improving the water guiding performance of the water guiding assembly 30.

It can be understood that, in a case that a width of the connecting portion 322 is provided to be less than or equal to a width of the fitting portion 312, to form, at an edge of the connecting portion 322, the discharge channel 323 butted with the guiding channel 314, in this way, when the water in the guiding channel 314 is drained to a position above the discharge channel 323, the water flows out of the frame 20 through the discharge channel 323. Therefore, the mounting component 32 in this embodiment not only functions to mount and fix the water guider 31, but also functions to drain the water in the water guide channel 314 out of the frame 20, so that no additional drainage structure is needed on the water guider 31, which simplifies the structure of the water guider 31, and thereby reducing the production cost of the water guider 31.

Secondly, since the clamping opening can be formed by cooperation between the mounting component 32 and the water guider 31, the water guider 31 is able to clamp on the frame 20 via the clamping opening without using screws, which simplifies the mounting process. Moreover, with the structural design of the fitting portion 312, the guiding channel 314 of the water guiding assembly 30 is further ensured to meet capillary action requirements while the mounting is simplified at the same time.

In a further embodiment, the inner wall of the guiding channel 314 of the water guider 31 has wettability, specifically, the inner wall of the guiding channel 314 is made of a wettable material, and thus the inner wall of the guiding channel 314 has wettability. Due to the wettability of the inner wall of the guiding channel 314, the accumulated water on the inner side of the frame 20 can flow along the inner wall of the guiding channel 314 to the discharge channel 323. The guiding channel 314 with wettability has a better water guiding performance.

It can be understood that, the structure of the water guider 31 in the embodiments of the present application may have many simplified forms. The two types listed below are only two of the preferable solutions. The water guider 31 in the embodiments of the present application includes but is not limited to the following two types.

Figure 2:
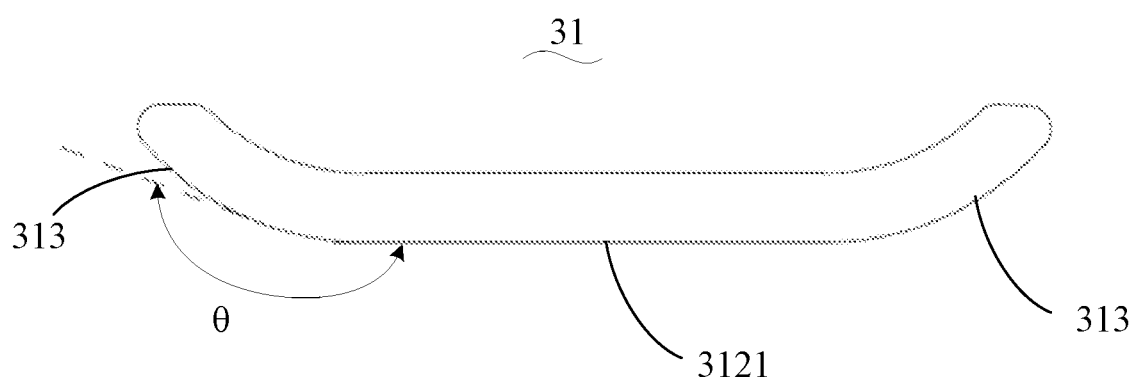
FIG. 2 is a schematic view showing the structure of a water guider in the water guiding assembly according to the embodiment of the present application.
Figure 4:
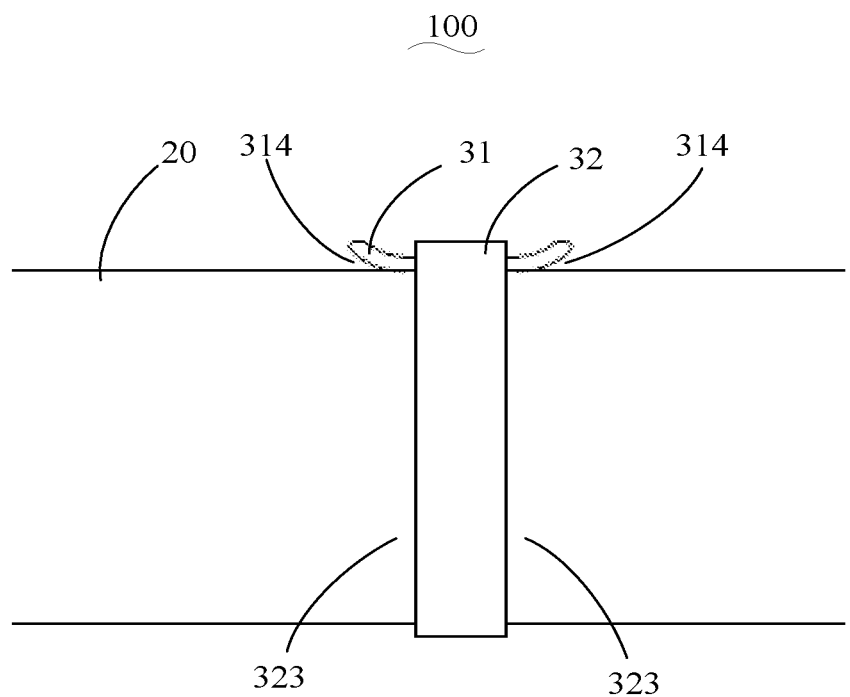
FIG. 4 is a schematic view showing the water guiding assembly according to the embodiment of the present application in the mounted state.

In an embodiment, reference is made to FIGS. 2 and 4. The fitting portion 312 of the water guider 31 has a fitting surface 3121, the water guiding portion 311 further has a water guiding surface 313 connected to the fitting surface 3121, and an angle is formed between the water guiding surface 313 and the fitting surface 3121, which is greater than 180 degrees, so that a gap is formed between the water guiding surface 313 and the frame 20 when the fitting surface 3121 abuts against the frame 20, to form the guiding channel 314. Specifically, the water guiding surface 313 is the inner wall of the guiding channel 314.

In this embodiment, the angle is shown as θ in FIG. 2, which is greater than 180 degrees, so that the water guiding surface 313 and the fitting surface 3121 are not on the same horizontal plane. Thus, when the fitting surface 3121 is fitted on the frame 20, there is a gap between the water guiding surface 313 and the frame 20, and the gap forms the guiding channel 314.

It can be understood that, the water guiding surface 313 may be a flat surface, which is arranged obliquely with respect to the fitting surface 3121. The water guiding surface 313 may also be an arc-shaped surface. Referring to FIG. 2, the arc-shaped water guiding surface 313 may be only provided at one side of the fitting surface 3121, or, the arc-shaped water guiding surface 313 may also be provided at each of both sides of the fitting surface 3121. Since the arc-shaped water guiding surface 313 has a larger effective area, it has a better water guiding performance.

Figure 5:
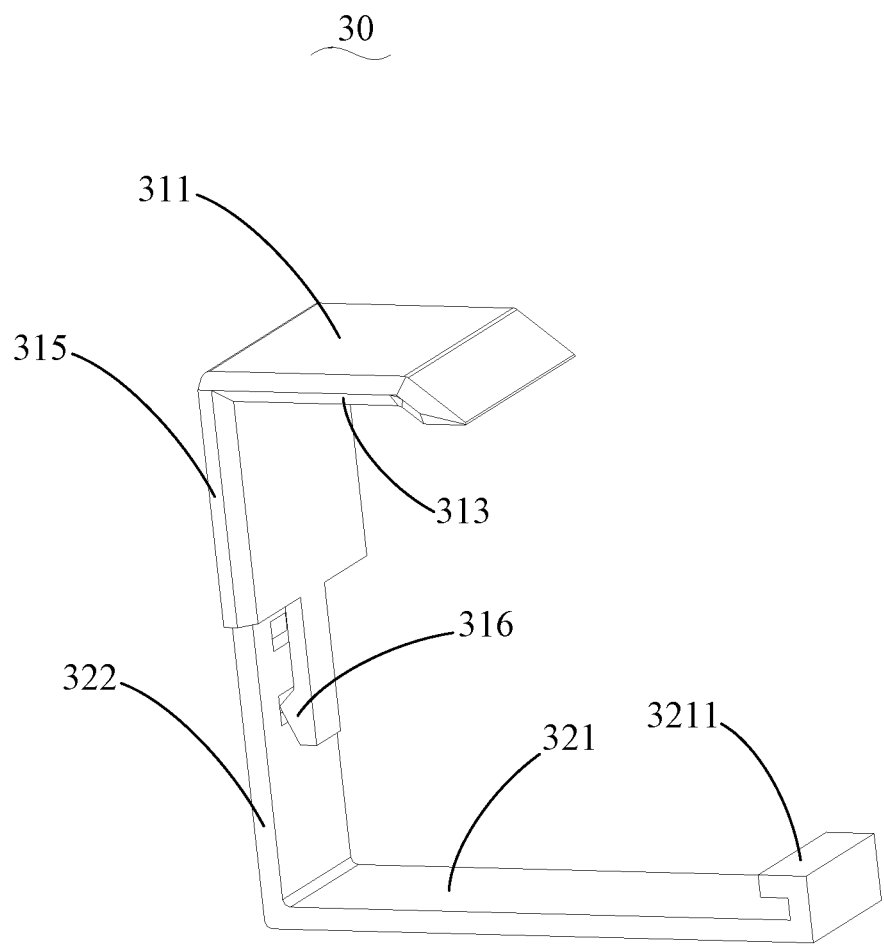
FIG. 5 is a perspective structural view of a water guiding assembly according to another embodiment of the present application from a first perspective.
Figure 6:
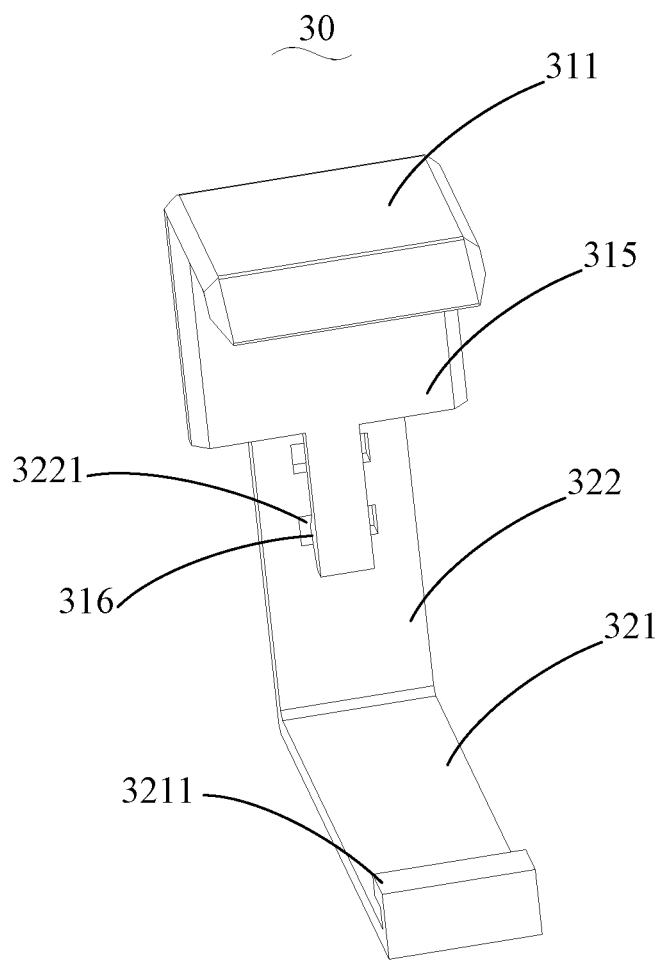
FIG. 6 is a perspective structural view of the water guiding assembly according to the another embodiment of the present application from a second perspective.
Figure 7:
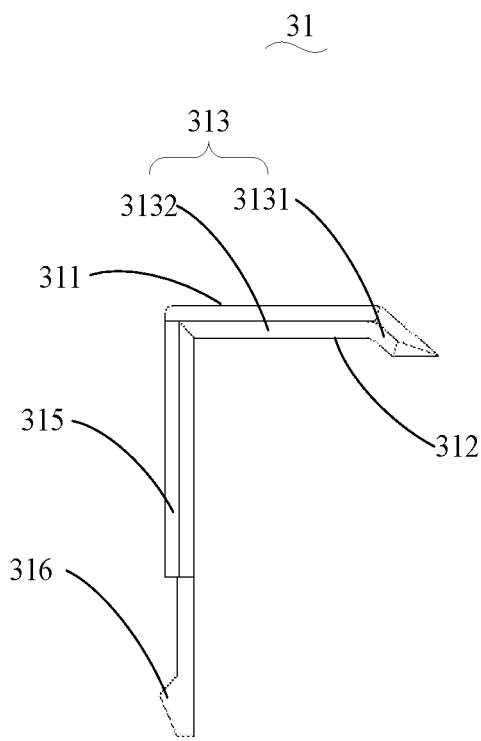
FIG. 7 is a schematic view showing the structure of a water guider of the water guiding assembly according to the another embodiment of the present application.
Figure 8:
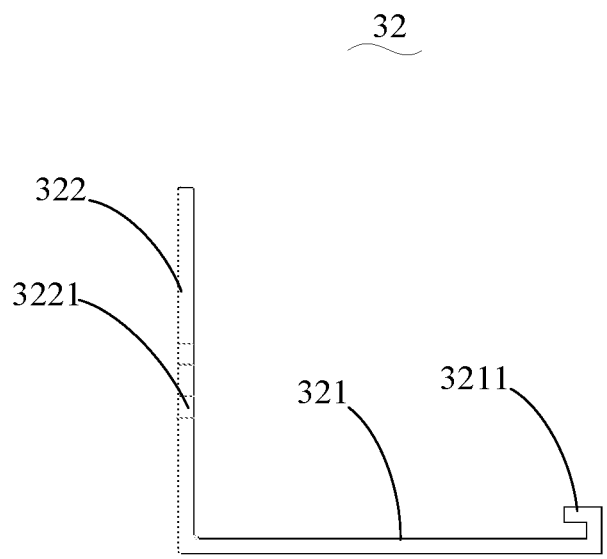
FIG. 8 is a schematic view showing the structure of a mounting component of the water guiding assembly according to the another embodiment of the present application.

In another embodiment, referring to FIGS. 5, 6 and 7, the water guiding portion 311 includes a water guiding surface 313, the fitting portion 312 is a boss protruding downward from the water guiding surface 313, and the fitting surface 3121, away from the water guiding surface 313, of the boss abuts against the frame 20.

Specifically, the water guiding portion 311 is a water guiding plate, one surface of the water guiding plate, facing the upper end face 21 of the frame 20, is the water guiding surface 313, and the boss protrudes downward from the water guiding surface 313. Thus, when the water guiding assembly 30 is mounted on the frame 20, the boss abuts against the frame 20, and the guiding channel 314 is formed between the water guiding surface 313 and the frame 20. In this way, a height of the boss is a width of the guiding channel 314.

It can be understood that, an area occupied by the boss on the water guiding surface 313 is smaller than an area of the water guiding surface 313. The water guiding surface 313 may be provided with one boss, and the boss is disposed at any position of the water guiding surface 313. Alternatively, the water guiding surface 313 may be provided with multiple bosses with a smaller length compared with a length of the boss in the above situation that only one boss is provided, the multiple bosses are arranged at intervals or in a staggered manner, and the multiple bosses ensure that the water guider is always stable.

In a further embodiment, the boss is arranged at a middle position of the water guiding surface 313, to divide the gap between the water guiding surface 313 and the frame 20 into at least two guiding channels 314, where the water is guided by the water guiding surface 313 toward a drainage surface. Herein, the drainage surface is a surface of the water guiding assembly 30 where the discharge channel 323 is located and close to the outer side face 23.

The boss extends along the direction in which the water flows into the guiding channel 314, so as to divide the gap between the water guiding surface 313 and the frame 20 into two guiding channels 314, where the water is guided by the guiding channel 314 toward the discharge channel 323.

That is, the boss is provided as a protrusion in the middle of the water guiding surface 313, and the boss divides the gap between the water guiding surface 313 and the frame 20 into two open guiding channels 314. That is, the guiding channel 314 having an opening at one side thereof is defined by the water guiding surface 313, the boss and the frame 20. In this embodiment, since the guiding channel 314 is open, if there are unwanted substances having large particle sizes on the glass layer 40 of the photovoltaic assembly, they can be discharged through the opening of the guiding channel 314. In addition, the opening also facilitates manual cleaning, which effectively prevents the guiding channel 314 from being blocked by the substances.

In a further embodiment, referring to FIG. 7, the water guiding surface 313 includes a first water guiding surface 3131 and a second water guiding surface 3132. The second water guiding surface 3132 has one end connected to the drainage surface and the other end connected to the first water guiding surface 3131. The first water guiding surface 3131 is arranged obliquely with respect to the second water guiding surface 3132, so that the first water guiding surface 3131 is located above the glass layer 40 of the photovoltaic assembly, to form a water guiding port with the glass layer 40. Where, the fitting portion 312 is arranged at the second water guiding surface 3132.

In this embodiment, the first water guiding surface 3131 is arranged obliquely with respect to the second water guiding surface 3132, so that the first water guiding surface 3131 extends toward the glass layer 40 located in the frame 20, to make the water guiding assembly 30 be in contact with the accumulated water on the glass layer 40, so as to introduce the accumulated water into the guiding channel 314.

In other embodiments, the first water guiding surface 3131 may also be an arc-shaped surface. In this way, the first water guiding surface 3131 is on the glass layer 40 and forms an arc-shaped water guiding port with the glass layer 40, which increases an contact area between the water guiding assembly 30 and the water, and thereby increasing the water guiding speed.

In the embodiments of the present application, the mounting component 32 and the water guider 31 may be connected in various manners, two of which are listed below.

Referring to FIGS. 5 to 8, in an embodiment, the mounting component 32 is buckled with the water guider 31. For example, the water guider 31 further includes a mounting portion 315, which is perpendicular to the water guiding portion 311. The mounting portion 315 is provided with a buckle 316 at an end that is away from the water guiding portion 311. The connecting portion 322 is perpendicular to the fixing portion 321 and is provided with a buckle slot 3221 at an end that is away from the fixing portion 321, and the buckle 316 is in a snap fit with the buckle slot 3221. Where, the buckle 316 may be an elastic buckle.

The specific mounting process is as follows. The water guiding portion 311 of the water guider 31 is placed on the upper end face 21 of the frame 20, and the mounting portion 315 is arranged to extend along the outer side face 23 of the frame 20 toward the lower end face 22 of the frame 20. The fixing portion 321 of the mounting component 32 abuts against the lower end face 22 of the frame 20, and the connecting portion 322 extends along the outer side face 23 of the frame 20 toward the upper end face 21 of the frame 20. The elastic buckle 316 of the mounting portion 315 is inserted into the buckle slot 3221, so that the water guider 31 and the mounting component 32 are buckled and fixed on the frame 20.

In this embodiment, the water guider 31 is fixed on the frame 20 through the elastic buckle 316, which is convenient to mount and easy to disassemble. Further, there is no need to improve the frame 20, which reduces the requirements of improving the photovoltaic assembly.

It can be understood that, since the mounting component 32 and the water guider 31 are in a snap fit with each other, a U-shaped clamping opening is formed by the mounting component 32 and the water guider 31 to clamp the frame 20, to realize quick mounting of the water guider 31. In order to improve the stability of the water guider 31, a barb 324 or the like is provided at a surface of the fixing portion 321 facing the frame 20, to enlarge friction between the fixing portion 321 and the frame 20, so as to improve stability. Alternatively, in preferred embodiment, an anti-separation buckle 3211 is provided at an end, away from the connecting portion 322, of the fixing portion 321, and the anti-separation buckle 3211 is configured to buckle the frame 20, to prevent the mounting component 32 from falling off from the frame 20. Specifically, the anti-separation buckle 3211 is a buckle groove that clasps an edge of the frame 20, so that the mounting component 32 is fixed on the frame 20.

Figure 9:
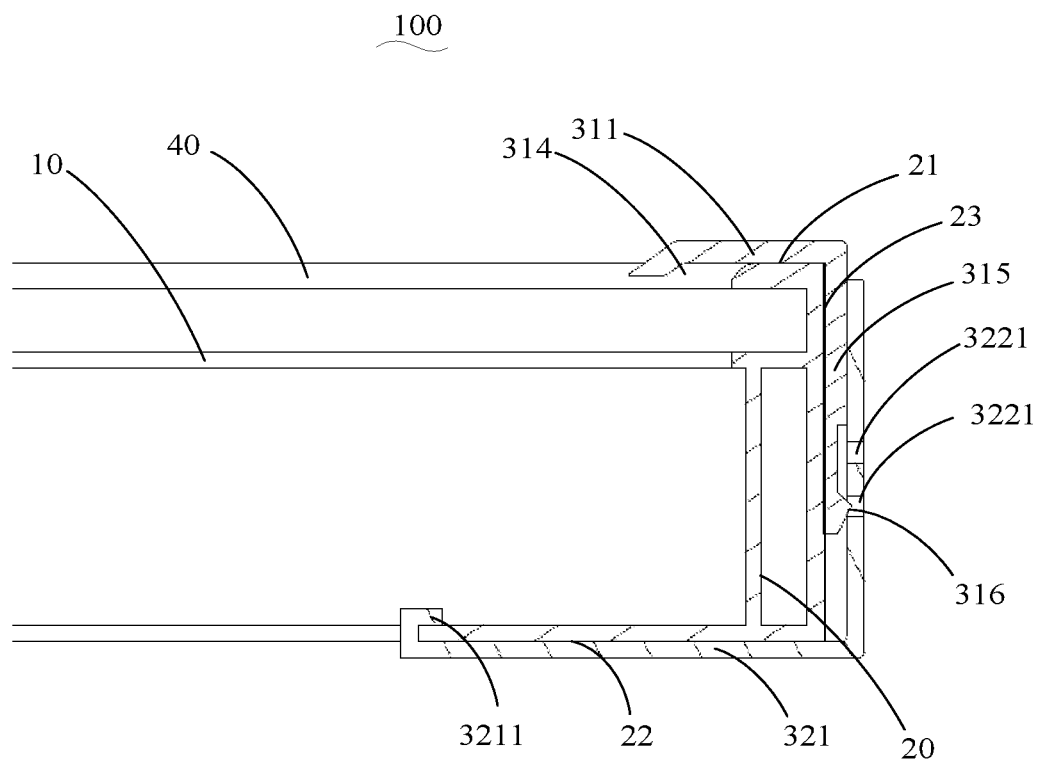
FIG. 9 is a schematic cross-sectional view of the water guiding assembly according to the another embodiment of the present application in a mounted state.
Figure 10:
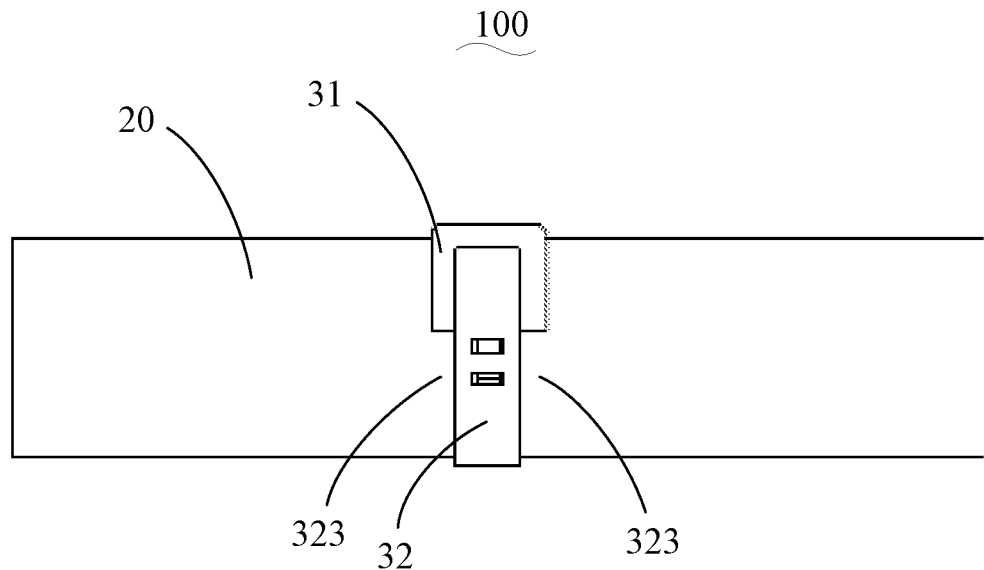
FIG. 10 is a schematic diagram view showing the water guiding assembly according to the another embodiment of the present application in the mounted state.

In a further embodiment, referring to FIGS. 9 and 10, the connecting portion 322 is provided with multiple buckle slots 3221 arranged at intervals in a direction toward the fixing portion 321. By providing the multiple buckle slots 3221 in the connecting portion 322, a corresponding buckle slot 3221 may be selected to be in the snap fit with the water guider 31 according to a height of the frame 20. That is, a distance between the water guider 31 and the mounting component 32 can be adjusted through the multiple buckle slots 3221. In this way, the mounting component 32 in this embodiment may be adapted to the mounting of various types of photovoltaic assemblies, which improves the applicability of the water guiding assembly 30 in this embodiment.

Figure 3:
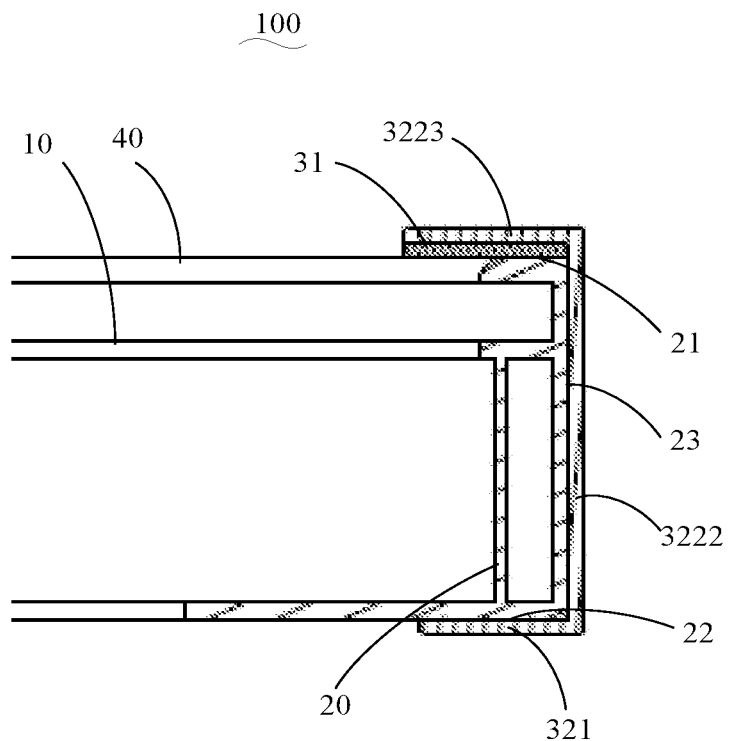
FIG. 3 is a schematic cross-sectional view of the water guiding assembly according to the embodiment of the present application in a mounted state.

Referring to FIGS. 1, 3, and 4, in another embodiment, the mounting component 32 and the water guider 31 are connected in an elastically pressing manner. For example, the connecting portion 322 includes a connecting segment 3222 and a pressing segment 3223 perpendicular to the connecting segment 3222, and the pressing segment 3223 presses against a surface, away from the fitting portion 312, of the water guiding portion 311.

Specifically, a U-shaped structure is defined by the pressing segment 3223, the connecting portion 3222, and the fixing portion 321. During the mounting process of the water guider 31, the water guider 31 is mounted on the upper end face 21 of the frame 20; the fixing portion 321 abuts against the lower end face 22 of the frame 20, and the pressing segment 3223 presses against the water guider 31. A distance between the pressing section 3223 and the fixing portion 321 is set to provide an interference fit with the frame 20, so as to tightly press the water guider 31 against the upper end face 21 of the frame 20.

The mounting component 32 in this embodiment has a simple structure and is convenient to mount.

In a further embodiment, in order to increase the stability of the mounting component 32, so as to improve the stability of the water guider 31, an anti-separation structure is provided on a surface, abutting against the frame 20, of the fixing portion 321, to prevent the fixing portion 321 from being separated from the frame 20 under an action of an external force, which may lead to separation of the water guider 31. Specifically, the anti-separation structure may be the barb 324 provided on the surface, abutting against the frame 20, of the fixing portion 321, or a rack provided on the surface abutting against the frame 20, of the fixing portion 321.

A photovoltaic module 100 is further provided according to the present application. Referring to FIGS. 1 to 10, the photovoltaic module 100 includes the photovoltaic assembly. The photovoltaic assembly includes the photovoltaic power generation layer 10, the glass layer 40, the frame 20, and the water guiding assembly 30, where the glass layer 40 is located above the photovoltaic power generation layer 10, and both the glass layer 40 and the photovoltaic power generation layer 10 are mounted in the frame 20. The guiding channel 314 with the water guiding port is formed between the water guider 31 of the water guiding assembly 30 and the top of the frame 20. The discharge channel 323 of the mounting component 32 of the water guiding assembly 30 butts with the guiding channel 314. The water guiding port is located on the glass layer 40, to drain the water or other substances on the glass layer 40 out of the frame 20 through the water guiding port, the guiding channel 314 and the discharge channel 323.

The water guiding assembly 30 employed by the photovoltaic module 100 in this embodiment is the water guiding assembly 30 described in the above embodiments, so the photovoltaic module 100 in this embodiment has all the beneficial effects of the water guiding assembly 30 described above.

It should be noted that, in order to accelerate the drainage of accumulated water on the glass layer 40 of the photovoltaic module 100, the photovoltaic module 100 includes at least two water guiding assemblies 30 arranged on the frame 20 at intervals, the two water guiding assemblies 30 guide water at the same time to increase the water guiding speed, so that the glass layer 40 of the photovoltaic module 100 can keep dry and clean all the time.

The embodiments described hereinabove are only preferred embodiments of the present application, and are not intended to limit the scope of the present application in any form. Although the present application is disclosed by the above preferred embodiments, the preferred embodiments should not be interpreted as a limitation to the present application. For those skilled in the art, many variations, modifications or equivalent replacements may be made to the technical solutions of the present application by using the methods and technical contents disclosed hereinabove, without departing from the scope of the technical solutions of the present application. Therefore, any simple modifications, equivalent replacements and modifications, made to the above embodiments based on the technical essences of the present application without departing from the technical solutions of the present application, are deemed to fall into the scope of the technical solution of the present application.

The invention claimed is:

1. A water guiding assembly applicable to a photovoltaic assembly, comprising:
a water guider, wherein the water guider comprises a water guiding portion, the water guiding portion has a fitting portion configured to abut against a frame of the photovoltaic assembly, to provide a gap between the water guiding portion and the frame to form a guiding channel; and
a mounting component, wherein the mounting component comprises a fixing portion and a connecting portion, the connecting portion has one end detachably connected to the water guider and another end connected to the fixing portion, to form a clamping opening with the water guider and the fixing portion; the clamping opening is configured to clamp the frame; wherein the connecting portion is provided with a discharge channel butted with the guiding channel.

2. The water guiding assembly according to claim 1, wherein an inner wall of the guiding channel has wettability.

3. The water guiding assembly according to claim 1, wherein
the fitting portion has a fitting surface, the water guiding portion further has a water guiding surface connected to the fitting surface, and an angle is formed between the water guiding surface and the fitting surface; and wherein
the angle is greater than 180 degrees, to allow the gap to be formed between the water guiding surface and the frame when the fitting surface abuts against the frame, to form the guiding channel.

4. The water guiding assembly according to claim 3, wherein the water guiding surface is an arc-shaped surface.

5. The water guiding assembly according to claim 3, wherein
the water guider further comprises a mounting portion perpendicular to the water guiding portion, and the mounting portion is provided with a buckle at an end that is away from the water guiding portion; and
the connecting portion is perpendicular to the fixing portion, the connecting portion is provided with a buckle slot at an end that is away from the fixing portion, and the buckle is in a snap fit with the buckle slot.

6. The water guiding assembly according to claim 3, wherein
the connecting portion comprises a connecting segment and a pressing segment, the pressing segment is perpendicular to the connecting segment, and the pressing segment is configured to press against a surface, away from the fitting portion, of the water guiding portion.

7. A photovoltaic module, comprising the photovoltaic assembly and the water guiding assembly according to claim 3, wherein
the guiding channel with a water guiding port is formed between the water guider of the water guiding assembly and a top of the frame of the photovoltaic assembly; and
the discharge channel of the mounting portion of the water guiding assembly is butted with the guiding channel, and the water guiding port is located at the photovoltaic assembly.

8. The water guiding assembly according to claim 1, wherein the water guiding portion comprises a water guiding surface, and the fitting portion is a boss protruding downward from the water guiding surface; the boss has a fitting surface configured to abut against the frame.

9. The water guiding assembly according to claim 8, wherein
the water guider further comprises a mounting portion perpendicular to the water guiding portion, and the mounting portion is provided with a buckle at an end that is away from the water guiding portion; and
the connecting portion is perpendicular to the fixing portion, the connecting portion is provided with a buckle slot at an end that is away from the fixing portion, and the buckle is in a snap fit with the buckle slot.

10. The water guiding assembly according to claim 8, wherein
the connecting portion comprises a connecting segment and a pressing segment, the pressing segment is perpendicular to the connecting segment, and the pressing segment is configured to press against a surface, away from the fitting portion, of the water guiding portion.

11. A photovoltaic module, comprising the photovoltaic assembly and the water guiding assembly according to claim 8, wherein
the guiding channel with a water guiding port is formed between the water guider of the water guiding assembly and a top of the frame of the photovoltaic assembly; and
the discharge channel of the mounting portion of the water guiding assembly is butted with the guiding channel, and the water guiding port is located at the photovoltaic assembly.

12. The water guiding assembly according to claim 1, wherein
the water guider further comprises a mounting portion perpendicular to the water guiding portion, and the mounting portion is provided with a buckle at an end that is away from the water guiding portion; and
the connecting portion is perpendicular to the fixing portion, the connecting portion is provided with a buckle slot at an end that is away from the fixing portion, and the buckle is in a snap fit with the buckle slot.

13. The water guiding assembly according to claim 12, wherein
the fixing portion is provided with an anti-separation buckle at an end that is away from the connecting portion, and the anti-separation buckle is configured to buckle the frame.

14. The water guiding assembly according to claim 12, wherein
the number of the buckle slot provided in the connecting portion is two or more, and the two or more buckle slots are arranged at intervals in a direction toward the fixing portion.

15. The water guiding assembly according to claim 1, wherein
the connecting portion comprises a connecting segment and a pressing segment, the pressing segment is perpendicular to the connecting segment, and the pressing segment is configured to press against a surface, away from the fitting portion, of the water guiding portion.

16. The water guiding assembly according to claim 1, wherein
a width of the connecting portion is less than or equal to a width of the fitting portion, to form, at an edge of the connecting portion, the discharge channel that is connected to the guiding channel.

17. A photovoltaic module, comprising the photovoltaic assembly and the water guiding assembly according to claim 1, wherein
the guiding channel with a water guiding port is formed between the water guider of the water guiding assembly and a top of the frame of the photovoltaic assembly; and
the discharge channel of the mounting portion of the water guiding assembly is butted with the guiding channel, and the water guiding port is located at the photovoltaic assembly.

\* \* \* \* \*